(12) United States Patent
Guebels

(10) Patent No.: US 7,071,788 B2
(45) Date of Patent: Jul. 4, 2006

(54) LOW POWER BALANCED COLPITTS OSCILLATOR WITH IMPROVED NEGATIVE RESISTANCE

(75) Inventor: Pierre Paul Guebels, Pleasanton, CA (US)

(73) Assignee: Phaselink Semiconductor Corporation, Labuan FT (MY)

( * ) Notice: Subject to any disclaimer, the term of this patent is extended or adjusted under 35 U.S.C. 154(b) by 49 days.

(21) Appl. No.: 10/973,279

(22) Filed: Oct. 27, 2004

(65) Prior Publication Data

US 2006/0097800 A1    May 11, 2006

(51) Int. Cl.
*H03B 5/36* (2006.01)

(52) U.S. Cl. .................... 331/46; 331/116 FE; 331/159

(58) Field of Classification Search ............... 331/46, 331/116 R, 116 FE, 158, 159, 177 R, 185
See application file for complete search history.

(56) References Cited

U.S. PATENT DOCUMENTS 2,494,321 A * 1/1950 Usselman ............... 331/49
3,581,235 A * 5/1971 Siu ....................... 331/113 R

* cited by examiner

*Primary Examiner*—David Mis
(74) *Attorney, Agent, or Firm*—Rosenberg, Klein & Lee

(57) ABSTRACT

A low power balanced Colpitts oscillator circuit with improved negative resistance. The oscillator circuit comprises two cross-coupled Colpitts oscillators with a crystal oscillator connected between the two oscillators. A single current source can be used for both Colpitts oscillators since only one Colpitts needs a current source at a time. Using a single current source cuts the power consumption in half. Alternatively, a transistor in each Colpitts oscillator can act as a current source, which is turned on or off depending on the state of the Colpitts transistor. The two current sources are biased at a common level and matched to ensure the circuit remains symmetrical. An additional benefit of the present invention is that the negative resistance is directly improved.

20 Claims, 2 Drawing Sheets

LOW POWER BALANCED COLPITTS OSCILLATOR WITH IMPROVED NEGATIVE RESISTANCE

BACKGROUND OF THE INVENTION

1. Field of the Invention

The present invention relates to an oscillator circuit. More specifically, the present invention discloses a low power balanced Colpitts oscillator with improved negative resistance.

2. Description of the Prior Art

Oscillator circuits are used for providing a reference frequency for other circuits or components in a system. As frequency requirements continue to rise, stability and phase noise performance become issues that can limit the effectiveness or efficiency of the oscillator circuit. This in turn directly affects the other circuitry utilizing the frequency signal.

In applications where phase noise and jitter sensitivity is of concern, standard phase locked loops are typically not usable. In these applications, non-PLL circuits are required.

Additionally, conventional oscillators can consume more power than is ideal for a low power consumption device.

Therefore, there is need for an efficient and effective oscillator circuit with low power consumption and improved negative resistance.

SUMMARY OF THE INVENTION

To achieve these and other advantages and in order to overcome the disadvantages of the conventional method in accordance with the purpose of the invention as embodied and broadly described herein, the present invention provides a low power balanced Colpitts oscillator with improved negative resistance.

The low power balanced oscillator circuit comprises a crystal oscillator connecting two cross-coupled Colpitts oscillators. The oscillators are cross-coupled by either a direct connection or by capacitors. The crystal oscillator provides the Colpitts oscillators with a reference frequency that is half a duty cycle out of phase for each Colpitts oscillator. In this way, the oscillator circuit effectively doubles the reference frequency.

A single current source can be used for both Colpitts oscillators. In contrast, if two current sources were used they would both be constantly active even though it isn't necessary whenever their respective Colpitts transistor is turned on. When one Colpitts transistor is on, the current source connected to the opposite transistor could in effect be turned off. Additionally, a transistor in each Colpitts oscillator can act as a switch that is controlled by the opposite Colpitts transistor's gate voltage due to cross-coupling the two Colpitts oscillators. Therefore efficient operation can be achieved by using a single current source, which reduces the current and power consumption in half.

Alternatively, a transistor in each Colpitts oscillator can be biased and act as a current source. These current sources are turned on or off depending on the state of the Colpitts transistor.

Furthermore, the sources of the transistors acting as current sources can be connected to ground. Grounding this node further improves the small loop gain and directly improves the absolute value of the negative resistance.

As a result, the present invention provides an efficient and effective oscillator with low power consumption and improved negative impedance.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
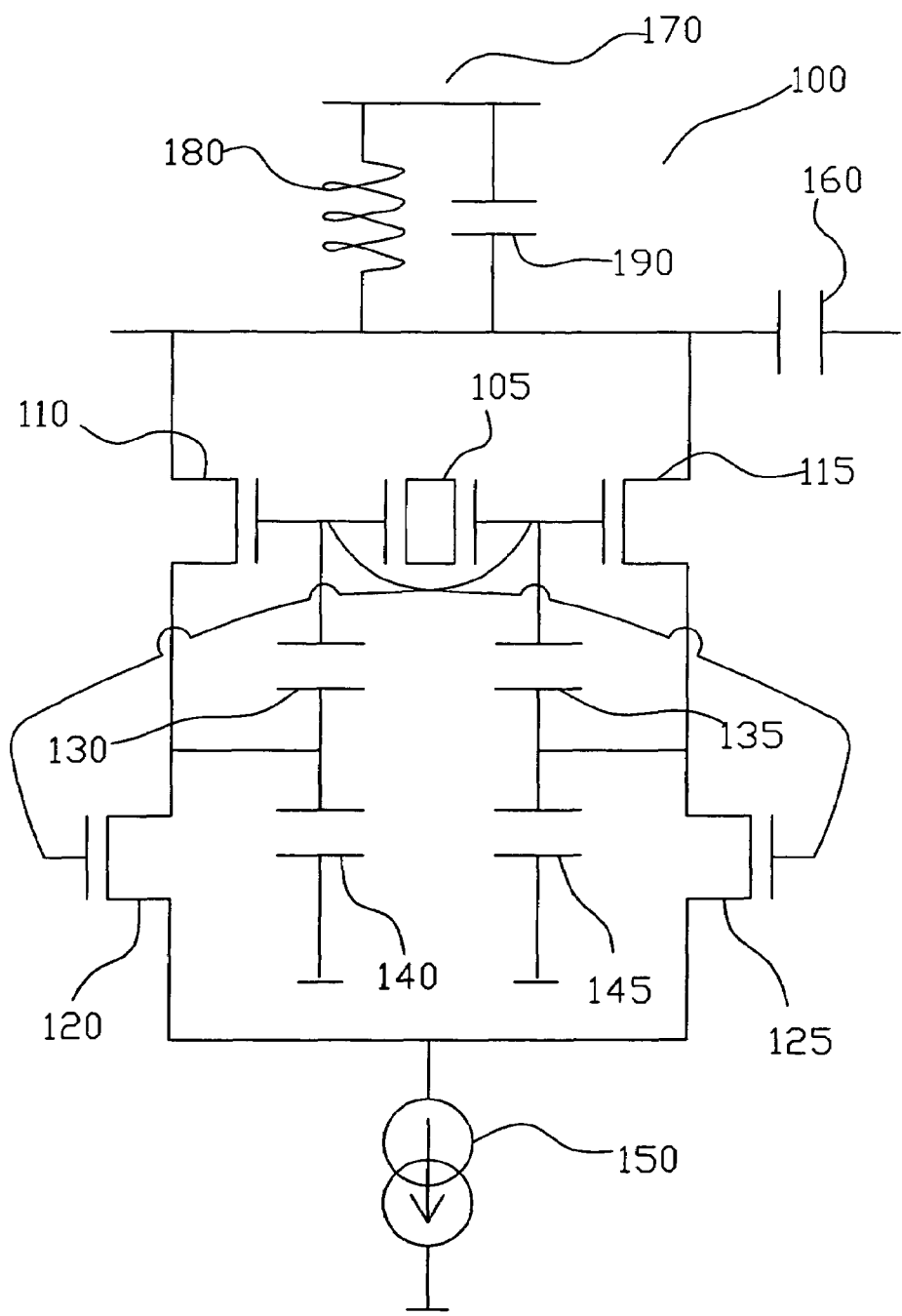
FIG. 1 is a circuit schematic of low power balanced Colpitts oscillator according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Refer to FIG. 1, which is a circuit schematic of low power balanced Colpitts oscillator according to an embodiment of the present invention.

As shown in FIG. 1, the low power balanced Colpitts oscillator 100 comprises a crystal oscillator 105 electrically connected between the gates of a first transistor 110 and a third transistor 115. A first capacitor 130 is connected between the gate and the source of the first transistor 110. A second capacitor 140 is connected between the source of the first transistor 110 and ground. The drain of a second transistor 120 is connected to the source of the first transistor 110.

A third capacitor 135 is connected between the gate and the source of the third transistor 115. A fourth capacitor 145 is connected between the source of the third transistor 115 and ground. The drain of a fourth transistor 125 is connected to the source of the third transistor 115. The sources of the second transistor 120 and the fourth transistor 125 are connected to a current source 150.

Furthermore, the gates of the first transistor 110 and the fourth transistor 125 are connected to each other and the gates of the second transistor 120 and the third transistor 115 are connected to each other.

A filter 170, comprising an inductor 180 and a filter capacitor 190 connected in parallel, is connected to the drains of the first transistor 110 and the third transistor 115. The filter 170 filters out the DC component present and further attenuates higher frequency harmonics.

A coupling capacitor 160 couples the oscillator circuit 100 to the next stage through AC coupling.

The Balanced Colpitts oscillator of the present invention basically comprises two oscillator circuits configured in a cross-coupled balanced configuration. Additionally, a crystal oscillator is connected between the gates of the transistors of both oscillator circuits.

The crystal oscillator provides a reference frequency to the oscillators. The reference frequency supplied to the first oscillator is a half period out of phase with the frequency supplied to the second oscillator. The drains of the transistors of each oscillator are connected together and this node will see the sum of the currents through each oscillator. As a result, the circuit of the present invention effectively doubles the reference frequency of the crystal oscillator.

In operation, the second transistor 120 and the fourth transistor 125 are controlled by the gate voltage of the third transistor 115 and the first transistor 110 respectively. In this way, the transistors are in a cross-coupled manner.

Taking advantage of the synchronized turning-on and off of the second transistor 120 and the fourth transistor 125, only one shared current source 150 is needed and is connected to both the second transistor 210 and the fourth transistor 125. As a result, the desired operation is achieved by using a single current source 150 instead of two. Therefore, the current and power consumption is reduced in half.

An additional benefit from the cross-coupling is the enhancement of negative resistance by 20 to 30% of the resulting circuit. This is very desirable in high frequency crystal oscillators and voltage controlled crystal oscillators.

Figure 2:
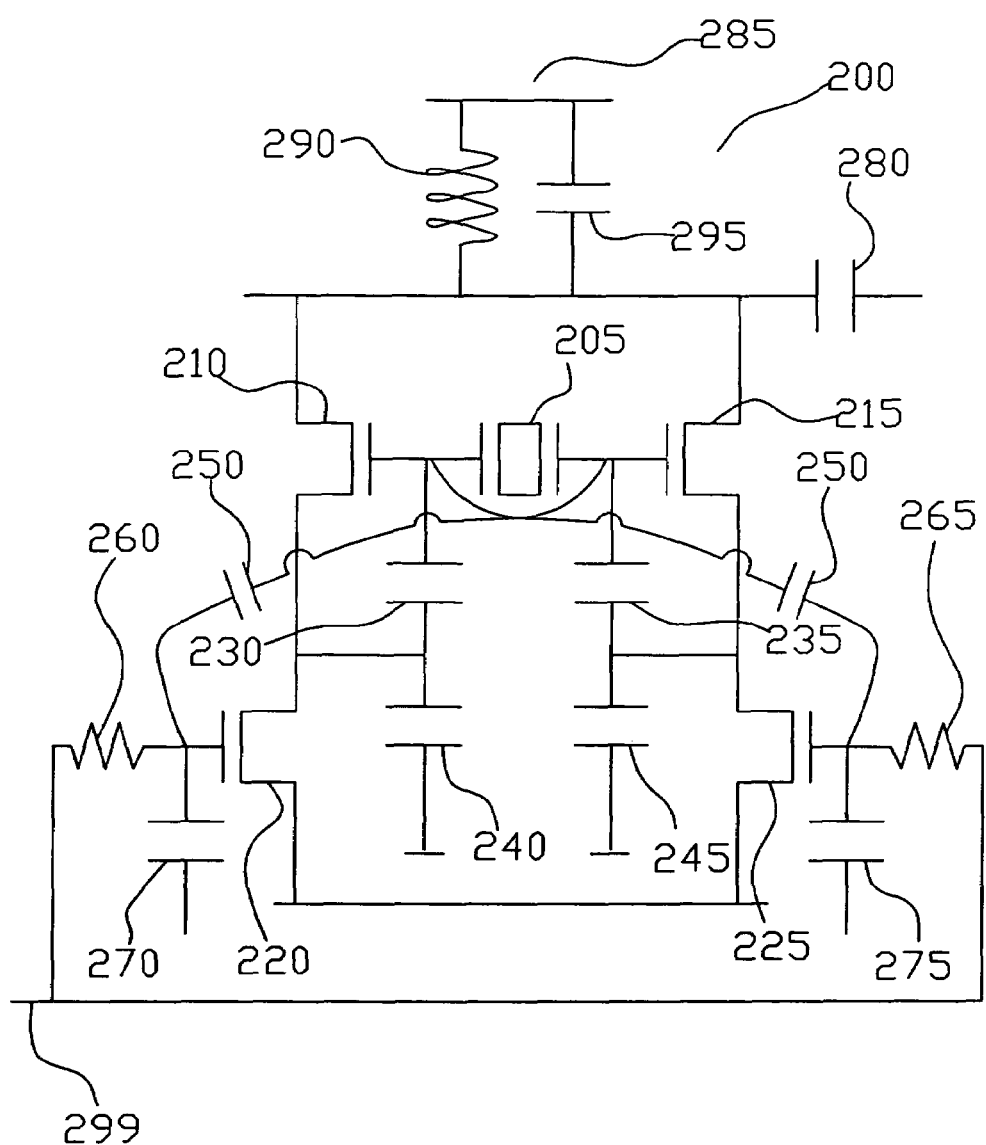
FIG. 2 is a circuit schematic of low power balanced Colpitts oscillator according to an embodiment of the present invention.

Refer to FIG. 2, which is a circuit schematic of low power balanced Colpitts oscillator according to an embodiment of the present invention.

As shown in FIG. 2, the balanced Colpitts oscillator 200 comprises a crystal oscillator 205 electrically connected between the gates of a first transistor 210 and a third transistor 215. A first capacitor 230 is connected between the gate and the source of the first transistor 210. A second capacitor 240 is connected between the source of the first transistor 210 and ground. The drain of a second transistor 220 is connected to the source of the first transistor 210.

A third capacitor 235 is connected between the gate and the source of the third transistor 215. A fourth capacitor 245 is connected between the source of the third transistor 215 and ground. The drain of a fourth transistor 225 is connected to the source of the third transistor 215. The sources of the second transistor 220 and the fourth transistor 225 are connected to ground.

A fifth capacitor 250 is connected between the gate of the third transistor 215 and the gate of the second transistor 220. A sixth capacitor is connected between the gate of the first transistor 210 and the gate of the fourth transistor 225.

In order to maintain symmetry in the circuit, the gates of the second transistor 220 and the fourth transistor 225 are connected to a bias node 299 via a first resistor 260 and a second resistor 265 respectively. A seventh capacitor 270 and eighth capacitor 275 are also connected to the gates of the second transistor 220 and the fourth transistor 225 respectively. The other ends of the seventh capacitor 270 and eighth capacitor 275 are floating.

A filter 285, comprising an inductor 290 and a filter capacitor 295 connected in parallel, is connected to the drains of the first transistor 210 and the third transistor 215. The filter 285 filters out the DC component present and further attenuates higher frequency harmonics.

A coupling capacitor 280 couples the oscillator circuit 200 to the next stage through AC coupling.

Similar to the operation described in regards to FIG. 1, the low-power Balanced Colpitts oscillator of the present invention basically comprises two oscillator circuits configured in a cross-coupled balanced configuration with a crystal oscillator connected between the gates of the transistors of both oscillator circuits. The crystal oscillator provides a reference frequency to the oscillators, which is supplied to the first oscillator a half period out of phase with the frequency supplied to the second oscillator. The drains of the transistors of each oscillator are connected together and this node will see the sum of the currents through each oscillator. As a result, the circuit of the present invention effectively doubles the reference frequency of the crystal oscillator.

In this embodiment, the second transistor 220 and the fourth transistor 225 are turned on or off depending on the state of the third transistor 215 and first transistor 210 respectively. In order to ensure that the circuit remains symmetrical, the second transistor 220 and fourth transistor 225 are biased at a common level and matched.

An advantage of the circuit illustrated in FIG. 2, is that by connecting the sources of the second transistor 220 and the fourth transistor 225 to ground, the small loop gain is improved. Therefore, the absolute value of the negative resistance directly increases. As a result a 100% to 200% improvement of the negative impedance can be achieved.

Therefore, the present invention provides a low power balanced Colpitts oscillator with improved negative resistance. By utilizing the synchronized turning-on and off of the switches, only one shared current source is required. As a result, the current and power consumption is reduced by half. Additionally, due to the cross-coupling, the circuit of the present invention has enhanced negative resistance, making the circuit ideal for high frequency crystal oscillator and voltage controlled crystal oscillator applications.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An oscillator circuit comprising:
   a first Colpitts oscillator;
   a second Colpitts oscillator cross-coupled to the first Colpitts oscillator; and
   a crystal oscillator connected between the first Colpitts oscillator and the second Colpitts oscillator.

2. The oscillator circuit of claim 1, the first Colpitts oscillator comprising:
   a first transistor comprising a first gate, a first source, and a first drain;
   a first capacitor connected between the first gate and the first source of the first transistor;
   a second transistor comprising a second gate, a second source, and a second drain, the second drain connected to the first source; and
   a second capacitor connected between the first source and ground.

3. The oscillator circuit of claim 2, the second Colpitts oscillator comprising:
   a third transistor comprising a third gate, a third source, and a third drain;
   a third capacitor connected between the third gate and the third source of the third transistor;
   a fourth transistor comprising a fourth gate, a fourth source, and a fourth drain, the fourth drain connected to the third source and the fourth source connected to the second source; and
   a fourth capacitor connected between the third source and ground.

4. The oscillator circuit of claim 3, further comprising:
   a filter connected to the first drain of the first transistor and the third drain of the third transistor.

5. The oscillator circuit of claim 1, further comprising:
a coupling capacitor to couple the oscillator circuit to a next stage.

6. The oscillator circuit of claim 3, further comprising:
a current source connected to the second source and the fourth source.

7. The oscillator circuit of claim 3, the cross-coupling comprising electrically connecting the third gate and the second gate and electrically connecting the first gate and the fourth gate.

8. The oscillator circuit of claim 3, further comprising:
a fifth capacitor connected between the third gate and the second gate; and
a sixth capacitor connected between the first gate and the fourth gate.

9. The oscillator circuit of claim 8, further comprising:
a bias node;
a first resistor connected between the second gate and the bias node; and
a second resistor connected between the fourth gate and the bias node.

10. A low power balanced oscillator comprising:
a first transistor comprising a first gate, a first source, and a first drain;
a second transistor comprising a second gate, a second source, and a second drain, the second drain connected to the first source;
a third transistor comprising a third gate, a third source, and a third drain, the third drain connected to the first drain;
a fourth transistor comprising a fourth gate, a fourth source, and a fourth drain, the fourth drain connected to the third source and the fourth source connected to the second source;
a crystal oscillator electrically connected between the first gate of the first transistor and the third gate of the third transistor;
a first capacitor connected between the first gate and the first source of the first transistor;
a second capacitor connected between the first source and ground;
a third capacitor connected between the third gate and the third source of the third transistor; and
a fourth capacitor connected between the third source and ground.

11. The low power balanced oscillator of claim 10, further comprising:
a current source connected to the second source and fourth source.

12. The low power balanced oscillator of claim 10, wherein the first gate is connected to the fourth gate and the second gate is connected to the third gate.

13. The low power balanced oscillator of claim 10, further comprising:
a fifth capacitor connected between the first gate and the fourth gate; and
a sixth capacitor connected between the second gate and the third gate.

14. The low power balanced oscillator of claim 13, further comprising:
a bias node for biasing the second and fourth transistors;
a first resistor connected between the second gate and the bias node; and
a second resistor connected between the fourth gate and the bias node.

15. The low power balanced oscillator of claim 10, further comprising:
a filter connected to the first drain of the first transistor and the second drain of the second transistor; and
a coupling capacitor to couple the low power balanced oscillator to a next stage.

16. A low power balanced oscillator comprising:
a first transistor comprising a first gate, a first source, and a first drain;
a second transistor comprising a second gate, a second source, and a second drain, the second drain connected to the first source;
a third transistor comprising a third gate, a third source, and a third drain, the third drain connected to the first drain;
a fourth transistor comprising a fourth gate, a fourth source, and a fourth drain, the fourth drain connected to the third source and the fourth source connected to the second source;
a crystal oscillator electrically connected between the first gate of the first transistor and the third gate of the third transistor;
a first capacitor connected between the first gate and the first source of the first transistor;
a second capacitor connected between the first source and ground;
a third capacitor connected between the third gate and the third source of the third transistor;
a fourth capacitor connected between the third source and ground;
a filter connected to the first drain of the first transistor and the second drain of the second transistor; and
a coupling capacitor to couple the low power balanced oscillator to a next stage.

17. The low power balanced oscillator of claim 16, further comprising:
a current source connected to the second source and fourth source.

18. The low power balanced oscillator of claim 16, wherein the first gate is connected to the fourth gate and the second gate is connected to the third gate.

19. The low power balanced oscillator of claim 16, further comprising:
a fifth capacitor connected between the first gate and the fourth gate; and
a sixth capacitor connected between the second gate and the third gate.

20. The low power balanced oscillator of claim 19, further comprising:
a bias node for biasing the second and fourth transistors;
a first resistor connected between the second gate and the bias node; and
a second resistor connected between the fourth gate and the bias node.

* * * * *